United States Patent [19]

Boudon

[11] Patent Number: 5,075,574
[45] Date of Patent: Dec. 24, 1991

[54] DIFFERENTIAL CASCODE CURRENT SWITCH (DCCS) LOGIC CIRCUIT FAMILY WITH INPUT DIODES

[75] Inventor: Gerard Boudon, Mennecy, France

[73] Assignee: International Business Machines Corporation, Armonk, N.Y.

[21] Appl. No.: 541,112

[22] Filed: Jun. 20, 1990

[30] Foreign Application Priority Data

Jul. 26, 1989 [EP] European Pat. Off. ........ 89480114.1

[51] Int. Cl.$^5$ ................. H03K 19/086; H03K 19/013; H03K 19/092; H03K 17/04
[52] U.S. Cl. .................................... 307/455; 307/443; 307/454
[58] Field of Search ............... 307/443, 454, 455, 475, 307/358, 362, 363, 542, 544, 547, 272.1

[56] References Cited

U.S. PATENT DOCUMENTS

| | | | |
|---|---|---|---|
| 3,942,033 | 5/1974 | Swaitowiec et al. | 307/254 X |
| 4,678,942 | 7/1987 | Kanai et al. | 307/455 |
| 4,739,194 | 4/1988 | Glasby et al. | 307/455 |
| 4,963,767 | 10/1990 | Sinh | 307/455 |
| 4,994,691 | 2/1991 | Naghshineh | 307/455 X |
| 4,996,445 | 2/1991 | Lin | 307/455 X |

FOREIGN PATENT DOCUMENTS

0176909 9/1985 European Pat. Off.
0320555 12/1987 European Pat. Off.

OTHER PUBLICATIONS

IBM Technical Disclosure Bulletin, vol. 28, No. 1, Jun. 1985, pp. 254-256, "Checking a Clocked Differential Cascode Logic".

*Primary Examiner*—Stanley D. Miller
*Assistant Examiner*—David R. Bertelson
*Attorney, Agent, or Firm*—Charles W. Peterson, Jr.

[57] ABSTRACT

The present logic circuit family is derived from the conventional DCCS logic circuit family. The logic circuit shown in the attached drawing is a six-input AND/NAND. It includes: a logic tree (41) comprised of bottom, middle, and top stages (44, 45, 46) cascoded and dotted at the tree output nodes (OUT, $\overline{OUT}$) to perform a determined logic function (F, $\overline{F}$). The top stage (46) includes a current switch (49) formed by a pair of input transistors (TX431, TX432) connected in a differential amplifier configuration. The base of one input transistor (TX431) on the left side of the tree is connected to the output of an AND gate, which consists of input diodes (D431, D432, ...) and resistor (RD41). True (IN PHASE) logic input signals (Z41, Z42, ...) are ANDed in this AND gate and a first elementary output signal, is available at the common emitter node (CN43) of the said differential pair. On the right side, additional inpout transistors (TX433,...) are paralleled with the other input transistor (TX432) of the differential pair, so that the complementary (OUT OF PHASE) input signals ($\overline{Z41}, \overline{Z42}, \ldots$) that drive the transistors, are ORed to deliver a second elementary output signal, complementary to said first elementary output signal, on said common emitter node (CN43). Same principle applies at the first and second levels to build the bottom (44) and middle (45) stages.

The present invention allows to increase the number of logical inputs to be applied to a DCCS logic circuit, and in turn, the number of logic functions performed in the logic DCCS tree. As a result, an extended library of DCCS logic circuits may be obtained.

10 Claims, 4 Drawing Sheets

DIFFERENTIAL CASCODE CURRENT SWITCH (DCCS) LOGIC CIRCUIT FAMILY WITH INPUT DIODES

BACKGROUND OF THE INVENTION

The present invention relates generally to logic circuits and more particularly to powerful combinational N level high cascoding logic tree circuits with embedded supplemental logic functions in the inputs that are capable of processing complex Boolean logic functions with a high number of logic inputs.

The cascode current switch (CCS) logic circuit family is derived from the well known Emitter Coupled Logic (ECL) circuit family. ECL circuits are characterized by a systematic usage of non saturated transistors, resulting in high speed performances. Given the obvious power of the ECL logic circuits, the CCS logic circuits are the ideal candidates for being implemented in high end computers. The CCS logic circuit technology has potentially superior power-performance attributes compared to other logic circuit technologies. The cascode structure improves the logic efficiency of the circuit library, in that it allows a great variety of logic functions to be available to the user, but, at the cost of a more complex design system. As a whole, the CCS circuit technology still remains highly desirable because of its fast switching speeds. Cascode type of circuits can be classified in two main logic circuit families: the single ended cascode current switch (SECCS) circuit family, which uses accurate reference voltages, and the differential cascode current switch (DCCS) circuit family.

Figure 1:
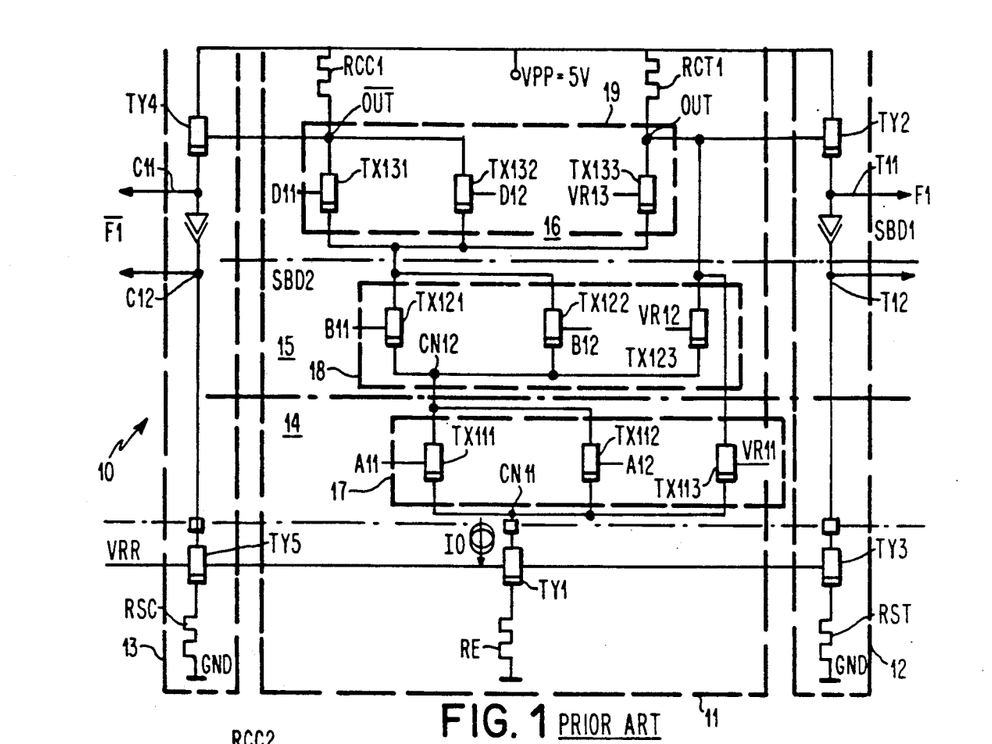
FIG. 1 shows a conventional three-level single ended cascode current switch (3L-SECCS) circuit of the prior art performing an OA/OAI logic function.

Several typical SECCS logic circuits are depicted in an article entitled "Simplified cascode reference generation" published in the IBM Technical Disclosure Bulletin Vol. 30 N° 4 Sept. 1987 pp. 1816–1819. A basic circuit belonging to this family is shown in FIG. 1 of the present application. Circuit 10 is a standard six-input NAND circuit consisting of a central three-level cascode current switch logic tree 11, driving two emitter-follower circuits 12 and 13 to supply the complementary circuit output signals: respectively the IN PHASE and OUT OF PHASE circuit output signals. Logic tree 11 comprises bottom, top, and middle stages 14, 15, 16 dotted at the tree output nodes to perform a determined logic function. Basically, circuit 10 is made of three sets of current switches referenced 17, 18, and 19 mounted in a cascade configuration to form the logic tree 11. Each current switch comprises a pair of input transistors in parallel connected in a differential amplifier configuration with a reference transistor. The bottom stage at the first level comprises input transistors TX111 and TX112 connected in a differential amplifier configuration with reference transistor TX113. Input transistors TX111 and TX112 receive binary logic input signals A11 and A12 respectively, that are applied to the bases of said input transistors. The base of reference transistor TX113 is connected to a reference voltage VR11. At the second level, middle stage 15 comprises input transistors TX121 and TX122 driven by input signals B11 and B12, and reference transistor TX123, whose base is connected to reference voltage VR12. Finally, at third level, top stage 16 comprises input transistors TX131 and TX132 driven by input signals D11 and D12, and reference transistor TX133 whose base is connected to reference voltage VR13. The common collector of transistors TX131 and TX132 is connected to load RCC1. Collector of transistor TX133 is connected to load RCT1. These nodes correspond respectively to the tree output nodes referenced out and OUT. The bottom stage is supplied by a constant current IO, determined by a conventional current source comprised of transistor TY1, the base of which is connected to a fixed reference voltage VRR (delivered by a reference voltage generator not shown), and resistor RE. Said constant current IO given by relation IO=((VRR−VBE(TY1))/RE), has to flow either through transistors TX113 or TX111 and/or TX112. As a matter of fact, it flows through the one transistor which receives the highest base voltage. The collector voltage of transistors TX111 or TX112 may drop to a low value as soon as the current flows through input transistors TX111 or TX112. Similar reasoning applies to other levels. The constant current source IO sets the power that the logic tree 11 will consume in performing its assigned logical function. The logic operation is accomplished through selectively steering the current through an adequate path within the tree to one of the three output three output summation points at their respective stage that are referenced CN11, CN12 and CN13. These summation points correspond to the common emitter node of a pair of input transistors and the corresponding reference transistor. Current steering is accomplished by applying logic input signals to each input transistors in the tree, that will select the input transistors to be turned ON. The three sets of current switches in circuit 10 are connected so that, to get a low voltage on the OUT node, corresponding to a logical "0," the current has to flow one path only from top to bottom through TX133 or TX123 or TX113. Circuit 10 further includes one translator stage per output, respectively referenced 12 for the true output (IN PHASE signal) and 13 for the complement output (OUT OF PHASE signal). Translator 12 comprises buffer transistor TY2 connected in an emitter-follower configuration and driven by the signal supplied at node OUT. The true circuit output signal representing the logic function F1 performed by circuit 10, is available at output node T11 or T12. Diode SBD1 is used as a level shifter to shift down the voltage at node T12. Transistor TY3 and resistor RST act as a constant current source for translator 12. Similar construction applies to translator 13 for the complement circuit output signal $\overline{F1}$ is available at node C11 or C12. Circuit 10 is biased between a first supply voltage, a positive voltage VPP=5V, and a second supply voltage, the ground GND. As a result, the logic Boolean function that is performed by circuit 10 is therefore F1 (A11+A12).(B11+B12). (D11+D12). Other functions like extended ORs, Exclusive ORs (XORs), etc... may also be obtained by changing the connections between the different sets of current switches and the number of transistors contained therein.

Figure 2:
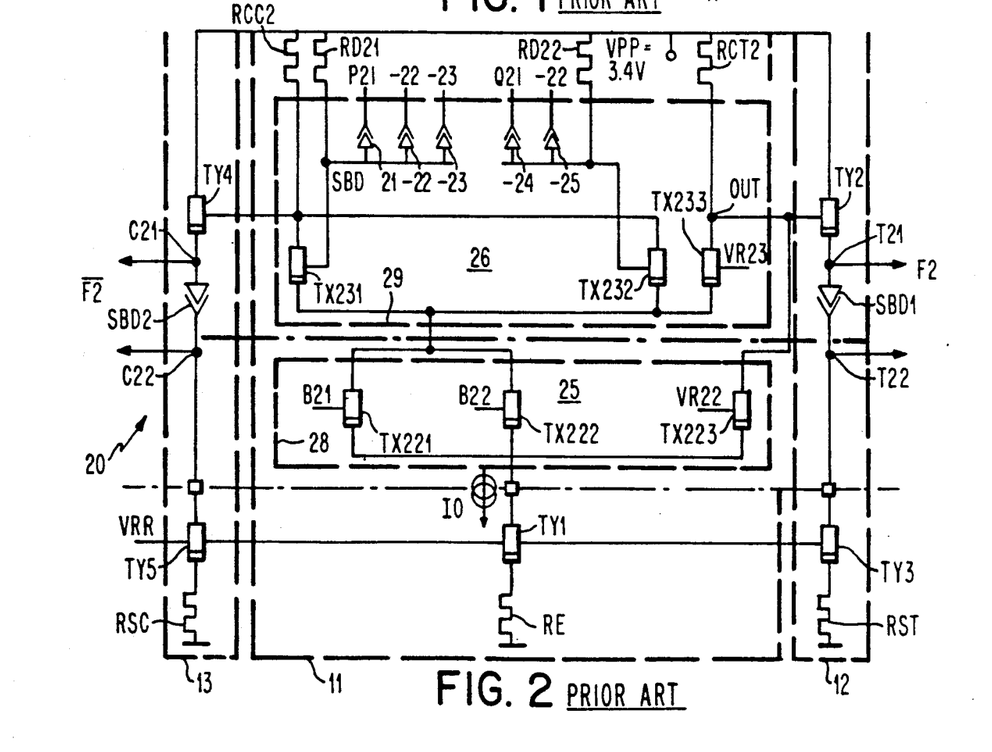
FIG. 2 shows a 3L-SECCS logic circuit of an improved type performing a two-two OA/OAI logic functions with one three-input AND and one two-input AND on the input transistors.

The OAI logic circuit depicted in FIG. 1 is of the single ended type because, only the true binary input logic signals (e.g. A11, A12, B11,...) are necessary. True input signals are applied to the bases of the input transistors, while the bases of other transistors so called reference transistors, are connected to a reference voltage (VR11, VR12, Circuit 10 comprises three cascode levels and works properly with VPP=5 V, but it is very doubtful that this circuit would operate satisfactorily with the very low supply voltages, e.g. VPP=3.4 V, that are used today in advanced computers. If three of more levels are necessary to increase the number of logical inputs, the conventional SECCS circuit of FIG. 1 would be no longer functional. As a result, the circuit library is limited in that respect. A significant improvement is described in copedinnng European patent application EP-A-87489923 filed on 15 Dec. 1987 and assigned to the same assignee as of the present invention. Based on the teachings of that disclosure, FIG. 2 of the present application shows a two-two OA/OAI logic circuit referenced 20, with one three-input AND one two-input AND gates connected to the input transistors. Circuit 20 is derived from the conventional three-level single-ended cascode current switch (3L-SECCS) logic circuit 10 of FIG. 1. Similar/corresponding elements bear similar/corresponding references. With respect to circuit 10 of FIG. 1, two major changes have been implemented in circuit 20 of FIG. 2. First, the transistors composing the first level have been removed, being a potential source of non-functionality, when low supply voltages, e.g. VPP=3.4 V, are used, as mentioned above. Secondly, the bases of input transistors TX231 and TX232 of the top stage 26 are respectively provided with three and two level shifter devices, referenced SBD 21-22-23 and SBD 24-25 respectively; each level shifter is connected to a logic input signal referenced P21-22-23 and Q21-22, respectively. Preferably, level shifter devices are Schottky Barrier Diodes (SBD's). Level shifter devices move the voltages towards the more positive voltage VPP. The role of these extra input diodes in combination with respective resistors RD21 and RD22 is to perform an additional AND function on each of these input transistors, thus compensating the loss of the first level when the number of levels is above three. The logic function at the true output of circuit 20 is given by F2 (B21+B22) (P21.P22.P23 +Q21.Q22). Because connecting input diodes that way, adds more than one level of equivalent logic function, more logical functions can be implemented in one single logic tree. As a result, the circuit library is significantly enhanced. However, although improved, the SECCS logic circuit family, still suffer from some major drawbacks, specific to that technology, that prevents it from being more extensively used. The first drawback is the need for accurate reference voltage generators. Such generators need complex circuitry to attain the desired stability and consume extra silicon surface. In addition, the very high noise sensitivity of SECCS circuits is a problem for their integration in a mixed type of circuit environment such as the BICMOS. This is due to the high voltage swing necessary to maintain enough noise margin and thus to accept some voltage drops on power supplies and on the reference voltages. This is a severe inconvenience because the BICMOS technology, that offers the capability to mix bipolar ECL and CMOS FETs circuits on the same chip for optimization of the power-delay product, appears to have a very promising future. Still another drawback of the SECCS circuits is speed, SECCS circuits are not the fastest of the CCS circuit family. In view of all of these inconveniences, it may be worthwhile to use the other type of the CCS logic technology mentioned above: the so called Differential Cascode Current Switch (DCCS) circuit technology, although the latter has also some inherent limitations, that will be discussed thereafter.

Figure 3:
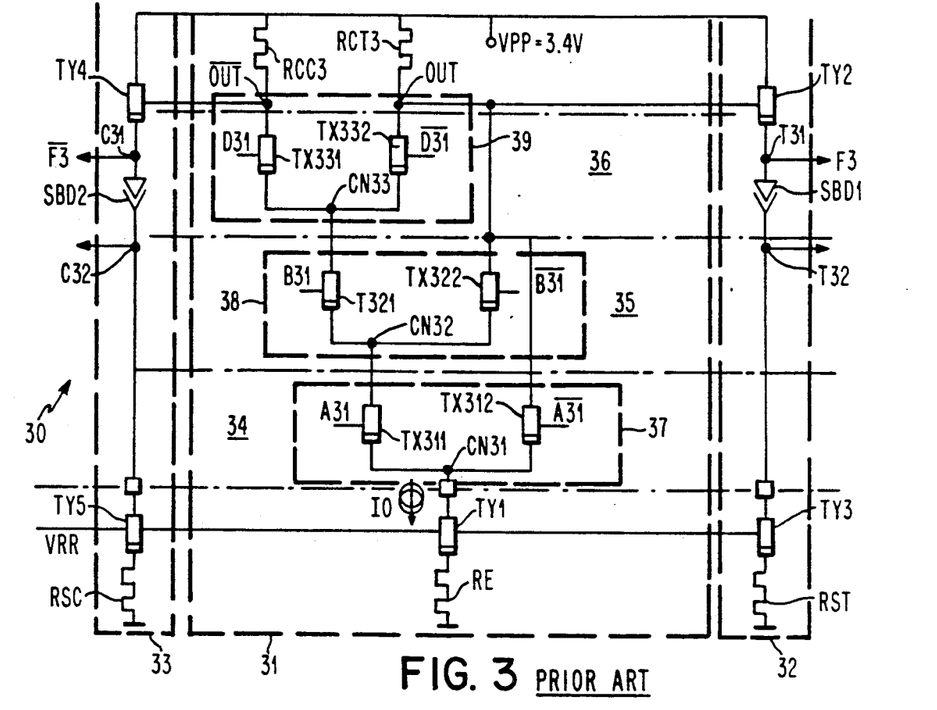
FIG. 3 shows a conventional three-level differential cascode current switch (3L-DCCS) circuit of the prior art performing a three-input AND/NAND logic function.

Differential cascode current switch (DCCS) circuit technology is also well-known to those skilled in the art. Basic principles have been soon disclosed, for example, in an article entitled "Cascode parity circuit" by E. L. Carter et al. published in the IBM Technical Disclosure Bulletin Vol. 24 N° 3 Aug. 1981 pp. 1705-1706. More details can be found in US-A-4760289 assigned to the same assignee as of the present invention. DCCS circuits may be easily derived from SECCS circuits, it suffices to remove one input transistor from the said pair and replace the said reference voltage that is applied to the reference transistor, by the appropriate complementary input. As a matter of fact, a conventional 3L-DCCS circuit performing a three-input AND/NAND function directly derived from circuit 10 of FIG. 1, is shown in FIG. 3 of the present application. Circuit 30 has a two branch structure and is typically implemented with NPN transistors and collector output usage. In the first level, bottom stage 34 consists of a current switch 37 comprising two input transistors TX311 and TX312 connected in a differential amplifier configuration, and driven respectively by binary input signals A31 and $\overline{A31}$. Similar construction applies to the second and third stages 35 and 36, each of which also consist of a current switch referenced 38 and 39 respectively. Binary logic input signals B31, $\overline{B31}$ and D31, $\overline{D31}$ are respectively applied to said second and third stages. Function F3 is given by F3 =A31.B31.D31. DCCS tree 31 is therefore made of three stacked differential pairs of NPN transistor receiving IN PHASE and OUT OF PHASE logic input signals on their respective bases. The emitters or each pair of transistors are tied together to form a common emitter node. These nodes are respectively referenced CN31, CN32 and CN33 for the first, second and third levels respectively and correspond to the summation points of the logic tree. It is a characteristic feature of DCCS circuit 30 to have only two distinct branches at each stage. For example, in the third stage one branch comprises transistor TX331 and resistor RCC3, the other branch comprises transistor TX332 and resistor RCT, with the tree output nodes $\overline{OUT}$ and OUT respectively connected therebetween.

The tree offers only one path for the current IO defined in the lower part of the circuit by a current source comprised of transistor TY1 and resistor RE. It is very important to notice that in DCCS circuit operation, only one transistor of the differential pair is ON, while the other is OFF. DCCS circuits are very high speed circuits because they operate with reduced voltage swings. In addition, they exhibit a relatively large noise immunity, because, the input signal is always compared to its complement. As a result, DCCS circuits are ideal candidates to be merged with CMOS circuits in a BICMOS single semiconductor chip, to speed up the critical data paths therein. However, the conventional DCCS circuits have also some drawbacks which have prevented them from becoming a generalized logic technology so far. For example, the major drawback of circuit 30 is the limited number of logic functions that can be implemented in the logic tree. This becomes more and more acute when low power supply voltages, e.g. 3.4 V, are used, as required for high end computers. With a 3.4 V power supply, only a maximum of three stages can be cascoded to implement circuit 30, to avoid functionality concerns. It is known by those skilled in the art, that the number of inputs in an AND circuit cannot exceeds the number of cascoded levels. If we suppose that the maximum of cascoded elements is three with a 3.4 to 3.6 V power supply, the Boolean function is then limited to three variables. As stated above, the cascode tree is defined by the stacking of three pairs of transistors to form the bottom, the middle and the top stages. Having in mind that only two paths are allowed by a pair of transistors, adding the middle stage offers four paths for the current with still only one path active at a time. Finally, adding the top stage to the structure permits a maximum of eight different path combinations. The conventional DCCS circuit family is thus limited to three-input AND/OR circuits at the maximum. As a consequence, DCCS circuits have a poor logic efficiency because the library of DCCS circuit is not as exhaustive as desired. In addition, the number of applications that can be derived from the DCCS circuit technology is also limited.

So there is a real need to date, of improving the conventional DCCS logic circuit technology is terms of logic efficiency, by adding supplemental AND/OR logic functions on the inputs of the circuits, while still keeping its inherent advantages, in particular in terms of speed and CMOS compatibility for BICMOS integration.

Therefore, it is a primary object of the present invention to provide a family of improved DCCS type logic circuits that are not limited to three levels of cascode due to the 3.4 V–3.6 V power supplies that are imposed to future bipolar technologies for high end computers.

It is another object of the present invention to provide a family of improved DCCS type logic circuits, functional down to the low supply voltage levels compatible with future CMOS products for BICMOS integration.

It is still another object of the present invention to provide family of improved DCCS type logic circuits wherein complex Boolean logic functions may be implemented with a high number of logic inputs at a very low cost.

It is still another object of the present invention to provide a family improved DCCS type logic circuits with a better power-performance product when compared with standard TTL/ECL logic gates.

It is still another object of the present invention to provide a family of improved DCCS type with a high number of logic inputs forming an exhaustive library of circuits, with a high number of logic functions available therein.

Basically, the present invention provides a family of logic circuits of the DCCS type including:

a logic tree formed by a plurality of stages cascoded and dotted to perform a determined logic function F between IN PHASE and OUT OF PHASE input signals (Z41, ... ;$\overline{Z41}$, ...) and its complement $\overline{F}$, at the tree output nodes in the top stage; wherein each stage of the current switch type basically consists of a pair of input transistors connected in a differential amplifier configuration, forming two independent branches and whose emitters are tied together to form a common emitter node;

a pair of load resistors to connect said output nodes to a first supply voltage;

a current source connected to a second supply voltage supplying a constant current to the common emitter node of the bottom stage of said logic tree;

CHARACTERIZED IN THAT at least one stage further includes:

first logic input means connected to the base of one input transistor driven by a first combination of said IN PHASE and OUT OF PHASE input signals to deliver a first elementary logic function on the common node of said stage; and, second logic input means connected to at least one electrode of the other input transistor driven by a second combination of input signals, to deliver a second elementary logic function, complementary to said first function, on said common emitter node where these functions are summed up.

SUMMARY OF THE INVENTION

In a preferred embodiment, said first logic input means is an AND gate that performs the logical AND between the IN PHASE (true) input signals. The second logic input means consists in paralleling additional transistors :;with said other input transistor, so that they are driven by the OUT OF PHASE (complement) input signals, to perform the logical OR between the OUT OF PHASE input signals.

The AND gate is typically made of unidirectional current conducting means, such as diodes: either SBD's for their best performance of diode connected NPN transistors, when said SBD's are not available in the technology. The present family of improved DCCS circuits may be operated from 3.3 to 5.0 V nominal power supply according to international standards, or even with any power supply insuring 3 V in the worst case. The above concept may be generalized to the implementation of a family of N-level DCCS circuits e.g., five to eight levels with a 5 V power supply.

BRIEF DESCRIPTION OF THE DRAWINGS

The novel features believed to be characteristic of this invention are set forth in the appended claims. The invention itself, however, as well as other objects and advantages thereof, may be best understood by reference to the following detailed description of illustrated embodiments, read in conjunction with the accompanying drawings:

DESCRIPTION OF THE PREFERRED EMBODIMENTS

We will describe first the principles of the new family of DCCS logic circuits provided with input diodes so called Diode Differential Cascode Current Switch (DDCCS) circuits according to the teachings of the present invention. An example of a basic logic circuits performing an AND/NAND logic function with an high input number count will be given first. Subsequently, a few examples of logic circuits performing different functions and pertaining to the family will be described. They are part of an exhaustive library of logic circuits which can be derived from the said basic circuit.

Figure 4:
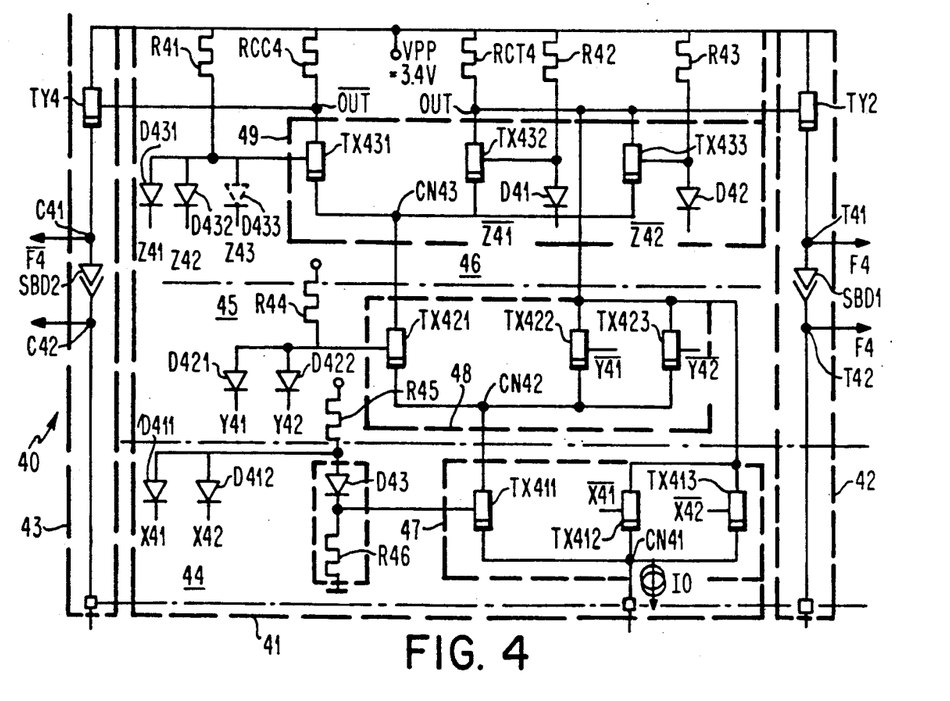
FIG. 4 shows a novel logic circuit of the improved family performing a six-input AND/NAND logic function with three cascoded two-input AND according to a first embodiment of the present invention.

Said basic logic circuit that is referenced 40 in FIG. 4 performs a six-input AND/NAND elementary Boolean function, and is used in order to illustrate the features and operation of the circuit family of the present invention. However, the present invention is not limited to this particular configuration. Basically, circuit 40 is broadly similar to circuit 30 of FIG. 3 to take full benefit of the systematic usage of an emitter-follower from a performance point of view, in order to get a good power-delay product. Circuit 40 is still made of three sets of current switches 47, 48, and 49 mounted in a differential amplifier configuration forming the cascode logic tree 41 of one output stage per output signal, respectively referenced 42 for the true output and 43 for the complement output. Output stages for the "true" and "complement" output signals are mounted in an emitter-follower configuration, as mentioned above. They act as translators, in order to adjust the logical levels of the circuit output signals and to amplify the output current. Current sources (not represented) are associated to each output stage and to the logic tree. The value of the current is selected according to the load, the dotting, and fan-out of circuit 40. Circuit 40 is still biased between $VPP=3.4$ V and the ground GND.

The invention will be best understood at the light of the circuitry of top stage 46 at the third level. Current switch 49 is comprised of input transistors, TX431 on the one hand, and TX432, TX433 on the other hand, connected in a differential amplifier configuration to form the top stage 46. In fact, only transistors TX431 and TX432 form the basic differential pair of transistors, according to two branches, so that two independent current paths from VPP to common node CN43 are so defined. The first path consists of resistor RCC4 and transistor TX431, with output node $\overline{OUT}$ coupled therebetween. The second path consists of resistor RCT4 and transistor TX432 with output node OUT coupled therebetween. On the left side of logic tree 41, diodes D431 and D432 so called input diodes, associated with resistor R41, form an AND gate driven by a combination of IN PHASE binary logic input signals Z41 and Z42. The output signal supplied by this AND gate is the logical AND between input signals Z41 and Z42 i.e., Z41.Z42. This output signal is applied to the base of transistor TX431. This output signal is therefore available with that polarity in the common emitter node of transistors TX431, TX432 and TX433 referenced CN43. Still considering the third level, on the right side of logic tree 41, transistors TX432 and TX433 are driven by the OUT OF PHASE signals $\overline{Z41}$ and $\overline{Z42}$ applied respectively to their bases. The OUT OF PHASE input signals $\overline{Z41}$ and $\overline{Z42}$ are summed up in node CN 43 through the OR dotting of transistors TX432 and TX433 connected in parallel. As a matter of fact, the elementary logic signal produced by transistors TX432 and TX433 on the common emitter node CN43 is given by $\overline{Z41}+\overline{Z42}$ (or $\overline{Z41.Z42}$). It is essential that this signal be the complement of the elementary logic signal, i.e., Z41.Z42, supplied by transistor TX431 to the node CN43 for an adequate operation. As a result, the signal available on the common emitter node CN43 is the sum of these elementary logic signals, i.e. $(Z41.Z42) + (\overline{Z41}+\overline{Z45})$. The potential at node CN43 is therefore quite constant, the current flows through TX431, when input signals Z41 and Z42 are at the high level, $Z41=Z42="1"$ or through TX432 when $Z41="0"$ and/or through transistor TX433 when $Z42="0."$ On the right side of current switch 49, it may be necessary to shift the signals from other trees (not represented) to tree 41 for performance optimization. This shift is ensured by a diode-resistor combination D41-R42 and D42-R43 respectively for complementary or OUT OF PHASE input signals $\overline{Z41}$ and $\overline{Z42}$. If the connections are short and the load light, said complementary input signals can be applied directly on the bases of TX432 and TX433.

At the second level, in middle stage 45, a quite similar solution is adopted. On the left side, an AND gate is formed with input diodes D421, D422 and resistor R44, and its output is connected to the base of transistor TX421. The signal that is applied to the base of transistor TX421 is the logical AND of input signals Y41 and Y42. On the right side of the tree, transistors TX422 and TX423 are connected in parallel and are directly driven by complementary input signals $\overline{Y41}$ and $\overline{Y42}$. The logic signal in common emitter node CN42 is therefore the sum of the elementary logic signals so produced, i.e. $Y41.Y42 + (\overline{Y41}+\overline{Y42})$.

The concept of the present invention can still be implemented at the first level, in bottom stage 44. The AND gate is formed by input diodes D411, D412 and resistor R45, while transistors TX411 and TX412 are paralleled to implement the OR dotting function. However, slight modifications may be necessary in some instances for voltage level adjustment. In that respect, a diode D43 is connected in series between the AND gate output and the base of transistor TX411, to have the output signal resulting from the ANDing of input signals X41 and X42, at two VBE's below VPP to avoid saturation problems in translators 42 and 43. A resistor R46 is connected between said base and the ground.

The global logic function F4 available at circuit output node T41 (or T42) is given by $F4 = X41 . X42 . Y41 . Y42 . Z41 . Z42$.

Input diodes that are used to improve the logic capability of the logic tree, are made of PN diodes or from diode connected NPN transistors but they can be replaced by Schottky Barrier Diodes (SBDs) as represented in FIG. 4 to further improve the circuit speed. Resistors R42 and R43 are chosen high enough to avoid a signal degradation due to a large Fan-Out of the previous DDCCS circuits driving the input diodes. It should be noticed that DDCCS circuit 40 operates with the same small swing signals and with the same high speed as for the traditional DCCS circuit 30 of FIG. 3. In some instances, due to problem of potential saturation, the input diodes must be used only on the second and third levels of the tree 41. Unlike input diodes, others diodes (e.g., SBD1) are used as shifter devices, they aim to ensure high driving capability on the circuit output signals which are always transmitted after an emitter-follower shifter circuit.

The improved DDCCS circuit of FIG. 4 exhibits significant advantages when compared to the circuit of FIG. 3. New logic functions have been added on the input transistors at the minor expense of a low-power consumption and small additional delay. The concept may be generalized to have more inputs. For example, to increase the number of inputs at the third level, it suffices to add an input diode, e.g., D433, to the AND gate and the corresponding NPN transistor, e.g., TX434 (not represented), in parallel with transistors TX432 and TX433. Note also that transistors TX432 and TX433 that form an OR function between complementary input signals $\overline{Z41}$ and $\overline{Z42}$ can be located in previous DDCCS logic trees (not represented), as soon as the appropriate logic function is available at node CN43.

Functionality can be assured down to 3.0 V minimum power supply at circuit level. The family may be operated from power supply values above this value, as well. For example, it can be operated from a 5V power supply. However, it is to be noted that power dissipation is proportional to the power supply value, but, compensated by the number of additional logic functions which can be implemented in a single DDCCS tree under 5 V.

In addition, coupling several input diodes as shown in FIG. 4, an AND function is added for each top stage, which in turn, increases the complexity of permitted logic functions with an increased number of logic inputs. A tree without said input diodes would perform a three-input AND/NAND as shown in FIG. 3, which is the maximum number of inputs for the 3L-DCCS circuit family. Others advantages include an improvement in density, due to the implementation of more complex functions per book or macro, while still maintaining the high speed of the DCCS type of circuits. The voltage swing and the current source values are related to the VBE forward voltage of transistors (the voltage swing is around 0.5 VBE).

It is remarkable to notice that the power-delay product is improved. It is difficult to evaluate this benefit, as it depends on the type of logic circuits or gates which are implemented. The circuit delay must be compared to the delay that would be obtained with other logic families.

Other circuits may be derived from these basic principles of the present invention as exposed with regards to circuit 40 of FIG. 4, to form an exhaustive library of circuits (or books). Different embodiments will now be detailed in conjunction with FIGS. 5 to 9.

Figure 5:
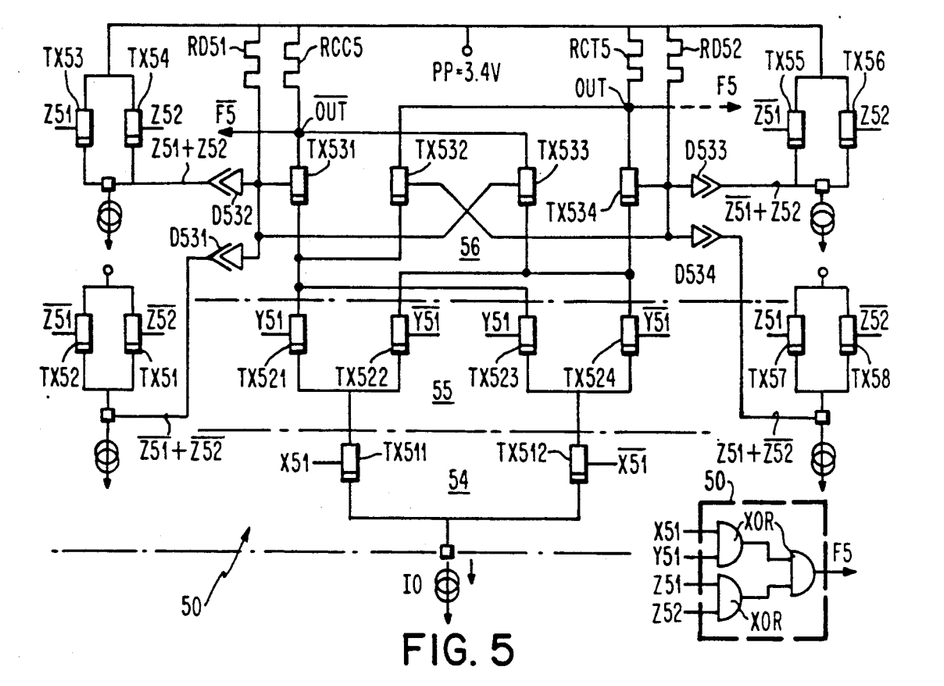
FIG. 5 shows a four-input Exclusive-OR (XOR) circuit according to another embodiment of the present invention.

As a first example, a four-input Exclusive OR (XOR) circuit 50 is shown on FIG. 5. In a conventional 3L-DCCS circuit technology, a XOR circuit is limited to three inputs. The novel DDCCS circuit 50 according to the present invention permits to add at least a fourth input. According to the basic principle of operation, the four different combinations of the true and complement of two logic input signals are first ORed by emitter-follower connections of four different pairs of parallel connected NPN transistors. The four different combinations resulting therefrom are complex input signals, that are then selectively ANDed in two two-input AND gates before being applied to two differential pairs of transistors. This is effected in the top stage 56 of the logic tree 51 to perform a two-input XOR. The XOR function between the two other logic input signals, is realized at first and second levels on stages 54 and 55 of circuit 50 as in a conventional DCCS circuit. A detailed description is given below.

Turning to the left side of circuit 50, parallel connected NPN transistors TX51 and TX52 driven by input signals $\overline{Z51}$ and $\overline{Z52}$ and supply complex input signal $\overline{Z52}$ supply complex input signal $\overline{Z51}+\overline{Z52}$ on their common emitter node. Similarly transistors TX53 and TX54 supply input complex signal $Z51 + Z52$ on their common emitter node. Those complex input signals are ANDed in the two-input AND logic gate comprised of diodes RD531, D532 and resistor R51, before being applied to the bases of transistors TX531 and TX533. Parallel connected NPN transistors TX56 and TX57 and transistors TX57 and TX58 respectively supply complex input signals $\overline{Z51}+Z52$ and $Z51+\overline{Z52}$ on their respective common nodes. Those complex input signals of the mixed type are ANDed in the two-input AND logic gate comprised of diodes D533, D534 and resistor RD52 before being applied to the bases of transistors TX532 and TX534. XOR circuit 50 is therefore comprised of two basic differential pairs of input transistors TX531 and TX532 on the left side, and TX533 and TX534 on the right side of circuit 50. When input signals Z51 and Z52 are equal, transistors TX531 and TX533 are "OFF" because one of the two combinations: $Z51 + Z52$ or $\overline{Z51}+\overline{Z52}$ is equal to "0" and both combinations, $\overline{Z52} + Z52$ and $Z51+\overline{Z52}$ are equal to "1," while transistors TX532 and TX534 are "ON" to perform the XOR function. The arrangement of the OR function obtained by the dotting of the emitters driven by the appropriate combination of input signals, ensures that at the third level, only one transistor of each differential pair is "ON" at a time. The circuit of FIG. 5 can even be extended to a five-input XOR circuit with a two-input XOR function performed at the second level, when implemented with the same circuit as depicted at the third level in stage 56. The true circuit output signal available at node OUT is given by F5 = X51 Y51 Z51 Z52. The XOR function between logic input signals X51 and Y51 is realized on first and second levels at stages 54 and 55 as in a conventional DCCS circuit. The output stages that are connected to the tree output nodes are not represented in FIG. 5.

Such DDCCS XOR circuits can be used with low power supplies equal to or less than 3.4 V that are required for future technologies to integrate very high speed and very dense circuits for high performance computers. For example, a 18 bit parity tree can be implemented either with six DDCCS circuits (with two DDCCS circuit delays), or with 51 two-input NAND circuits (with 11 two-input NAND delays in a standard TTL/ECL logic, or finally with 9 DCCS circuits (with 3 DCCS circuit delays), should the 3L-DCCS circuits with a limited number of inputs be used. It is clear that the implementation of XOR circuits with standard logic gates requires a large number thereof. For a comparator, the use of DDCCS circuits with input diodes to increase the number of logic inputs reduces power and improves speed of operation.

Figure 6:
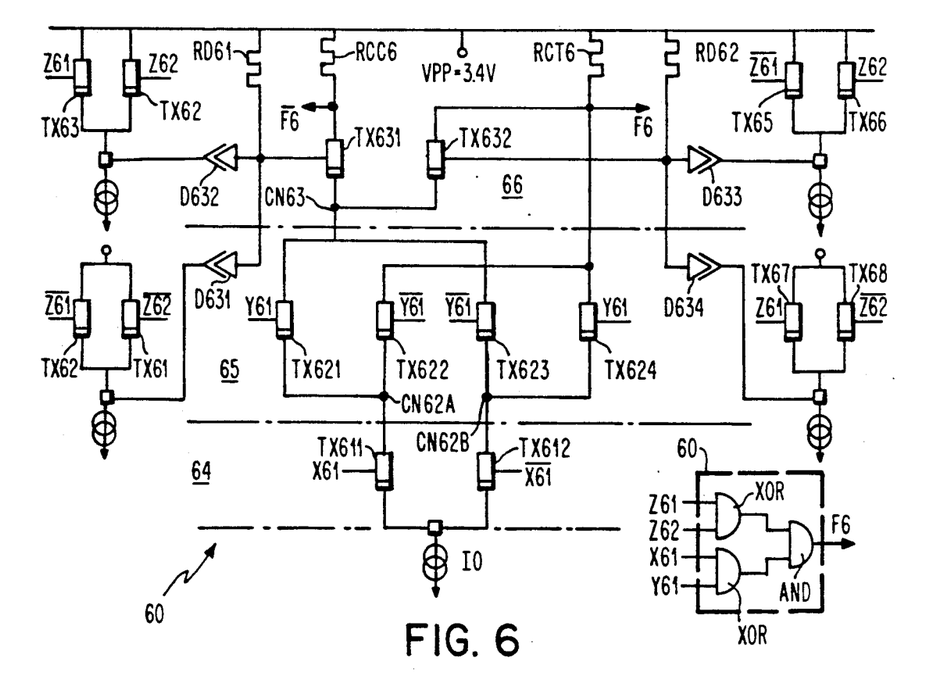
FIG. 6 shows a two-bit compare circuit that can be derived from the XOR circuit of FIG. 5.

A two-input bit compare circuit is now given as a further example. The two-input bit compare circuit 60 shown in FIG. 6 is structurally and functionally very similar to circuit 50 of FIG. 5. In the present circuit there is only one pair of differential input transistors, say TX631 and TX632. The XOR of input signals Z61 and Z62 is performed at the third level in stage 66 with input diodes D631-632, resistor RD61 on the left side and input diodes D633-634, resistor RD62 on the right side of circuit 60. These diode/resistor combinations are used as "AND" gates, while the emitters of transistors TX631 are dotted ensure the "OR" at common emitter node CN63 to sum up the elementary logic functions. The XOR of input signals X61 and Y61 is done as in a classical DCCS circuit at the first and second levels. The AND between the Z61 Z62 and X61 Y61 complex input signals is obtained by cascoding the pair of differential transistors TX631 and TX632 (which provides (Z61 Z62) with the two transistor pairs of the lower stages, in a very similar way as achieved in circuit 50 in FIG. 5.

Figure 7:
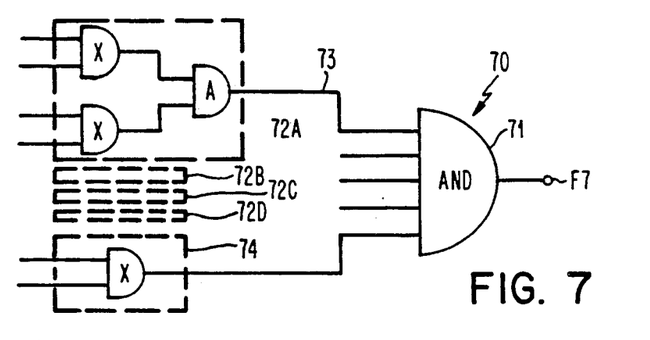
FIG. 7 shows the logic diagram of a nine-bit compare circuit bit with four two-bit compare circuits of FIG. 6, to demonstrate the high logic efficiency of the improved family of logic circuits.

The nine-bit comparator circuit 70 shown in FIG. 7 is built with one five-input AND gate 71, four DDCCS two-bit compare circuits, such as depicted in FIG. 6, referenced 72A to 72D, connected thereto through lead bundle 73 and one extra two-input DDCCS XOR circuit 74. Circuits 72A to 72D are identical to circuit 60 depicted in FIG. 6. Note that circuits 71 and 74 can be merged in the DDCCS logic circuit with two-input diodes on the second level and two input diodes on the third level.

Still another example is given with a DDCCS decoder. DCCS decoder circuits are widely used in RAM's for their high speed operation. With a 5 V power supply, five levels are permitted, so that a standard DCCS decoder has the capability of addressing 5 bits to select $2^5 = 32$ word lines. With a 3.4V/3.6V power supply, only 3 levels are possible as explained above, giving only $2^3 = 8$ word lines that can be addressed. A DDCCS decoder circuit according to the present invention is disclosed below. With a 3.4 V power supply, it permits a minimum of 5 bits decoding to select a minimum of 32 word lines.

Figure 8:
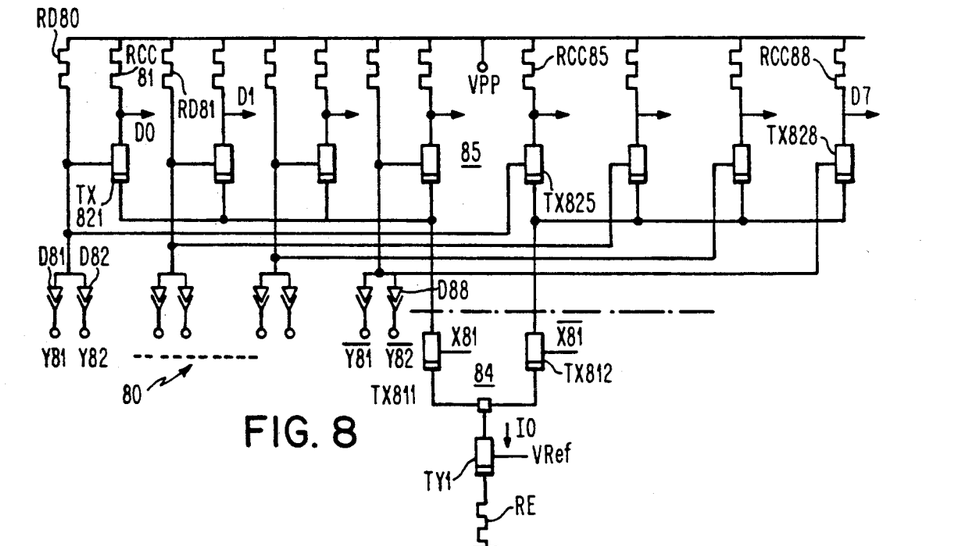
FIG. 8 shows a three-bit address negative decoder according to a further embodiment of the present invention.

A DDCCS decoder of the negative type circuit is shown in FIG. 8. For sake of simplicity, decoder 80 has only two levels of cascode, but the circuitry on the second level could be copied to a third level (not represented) to give a five-input decoder. Decoder 80 is comprised of a plurality of eight NPN input transistors referenced TX821 to TX828 whose collectors are connected to VPP through load resistors, respectively RCC81 to RCC88. The data is available on the collectors of these transistors, e.g., DO. As apparent from FIG. 8, the bases are coupled by two, e.g., the base of transistors TX821 and TX825 are tied together. The common node resulting therefrom, is driven by the output signal supplied by an AND gate. For example, the AND gate that drives the common base node of transistors TX821 and TX825 comprises input diodes D81, D82 driven by input signals Y81 and Y82, and resistor RD80. The decoding is performed on the first level at bottom stage 84 with a differential pair of NPN transistors TX811 and TX812 controlled by the X81 and $\overline{X81}$ input signals. On the second level, at stage 85, the four combinations of complex input signals Y81.Y82, $\overline{Y81}$.Y82, Y81.$\overline{Y82}$, $\overline{Y81}.\overline{Y82}$ are achieved through the input diodes, D81 to D88. Preferably input diodes are SBD's. Only one anode is up, and only one NPN transistor on the second level is "ON" at a time, giving a path for current IO which gives the "0" at only one, output node, e.g., DO. For example if address 7 is selected, input signals X81, Y81, Y82, are at "1" and the path current is through TX811, TX821 and RCC80, as a result, output node DO is at low level "0," while others output nodes are at a high level.

A positive decoder with three true complement address inputs selecting one of the eight outputs, can be easily derived therefrom. One output node is up at a time, with the seven current sources derived in seven out of the eight resistances. It can be noticed that only two levels of cascode are used and that the third level can be used to extend the number of selected lines by a factor of two, four, etc...

Figure 9:
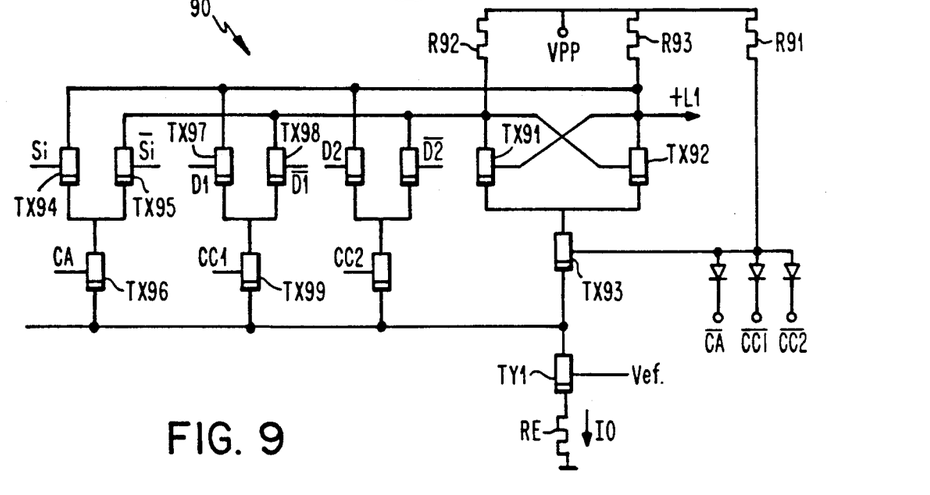
FIG. 9 shows a two-port Polarity Hold Shift Register Latch (PHSRL) implemented with the LSSD technique, according to a still further embodiment of the present invention.

Now turning to FIG. 9, still another example is given: a two-port Polarity Hold Shift Register Latch (PHSRL) implemented according to the conventional LSSD technique. Circuit 90, which uses a multiplexing of its data input signals, can be built with only two levels of cascode according to the teachings of the present invention. The number of multiplexed input signals can be extended without increasing the number of cascode levels. When the clock signals CA, CC1 and CC2 are low, the complementary signals are high, and current IO flows in the master storage cell consisting of cross-coupled transistors TX91 and TX92, to maintain the data. When one clock is high, circuit 90 is in a WRITE mode and the output signal L1 is set to the same binary value that the data. The data Si (Scan in), D1 and D2 are ANDed in the circuit before being transferred to the master at the time when one of the clocks is active (high level). The inputs of the slave (not represented) are directly tied to the collectors of TX91 and TX92. An interesting feature of circuit 90 consists in that it may be clock driven from any book of the library, since it does not require a specific clock driver. Again, the output stages are not represented in FIG. 9.

There is no difficulty to extend further the logic that can be incorporated into the latches of this type of circuit. The number of data inputs can be increased by paralleling more transistors. An AND-OR logic function on one data path might be included as associated to the CC1 clock. This function would be included into the latch at no power expense and at a very small performance penalty. A three-port PHSRL circuit with logic extension on data path, and ORing extension on clock path is easily achievable according to the present invention.

In summary, the present invention proposes to provide IN PHASE and OUT OF PHASE signals on the base of the transistor pair, and extend the concept to more than 2 transistor in each "pair" as far as their is always only one path for the current coming from the bottom part of the circuit.

A new family of DCCS circuits so called the DDCCS circuits, with improved logic capability is obtained through the usage of input diodes, has been described. As the circuits operate with a very low signal swing and without any problem of reference stability or accuracy as in the conventional SECCS circuits, the DDCCS circuits of the present invention can provide very high speed with a good power-delay product trade-off.

I claim:

1. A logic circuit of the DCCS type including:
   a logic tree (41) formed by a plurality of stages (44, 45, 46) cascoded and dotted to perform a determined logic function F between IN PHASE and OUT OF PHASE input signals (Z41,...; $\overline{Z41}$,...) and its complement $\overline{F}$, at the tree output nodes (OUT, $\overline{OUT}$) in the top stage (46); wherein each stage (e.g., 46) of the current switch type basically consists of a pair of input transistors (e.g., TX432, TX431) connected in a differential amplifier configuration, forming two independent branches and whose emitters are tied together to form a common emitter node (e.g., CN43);

a pair of load resistors (RCT4, RCC4) to connect said output nodes (OUT, $\overline{OUT}$) to a first supply voltage (VPP);

a current source connected to a second supply voltage supplying a constant current (IO) to the common emitter node (CN41) of the bottom stage (44) of said logic tree (41);

CHARACTERIZED IN THAT at least one stage (e.g., 46) further includes:

first logic input means connected to the base of one input transistor driven by a first combination of said IN PHASE and OUT OF PHASE input signals to deliver a first elementary logic function on the common node of said stage; and, second logic input means connected to at least one electrode of the other input transistor driven by a second combination of said input signals, to deliver a second elementary logic function, complementary to said first function, on said common emitter node where these functions are summed up.

2. The logic circuit of claim 1 wherein said first input means consists of an AND gate (D431, D432, R41) whose output is connected to the base of said one input transistor (TX431), and which performs an AND function between the IN PHASE input signals (Z41, Z42, ...).

3. The logic circuit of claim 2 wherein said second input means consists of a plurality of additional input transistors (TX433, ...) connected in parallel with said other input transistor (TX432); and wherein the base of said other input transistor is driven by one OUT OF PHASE input signal ($\overline{Z41}$), and the bases of said additional input transistors are driven by the remaining of said OUT OF PHASE input signals($\overline{Z42}$, ...).

4. The logic circuit of claim 1 wherein said first input means consists of a two-input AND gate (D631, D632, RD61) whose output is connected to the base of said one input transistor (TX631); said two-input AND gate being driven in turn by the signals supplied by two two-input OR gates (TX61, TX62; TX63, TX64); the first OR gate being driven by a couple of IN PHASE input signals (Z61, Z62) and the second OR gate being driven by the corresponding couple of OUT OF PHASE input signals ($\overline{Z61}$, $\overline{Z62}$); and , wherein said second input means consists of a two-input AND gate (D633, D634, RD62) whose output is connected to the base of said other input transistor (TX632); said two-input AND gate being driven in turn by the signals supplied by two two-input OR gates (TX65, TX66; TX67, TX68); the first OR gate being driven by a couple of mixed IN PHASE and OUT OF PHASE input signals (Z61, $\overline{Z62}$), and the second OR gate being driven by the couple of complementary input signals ($\overline{Z61}$, Z62).

5. The logic circuit of claim 2 further comprising a pair of differential transistors connected to each transistors and respectively connected to said output nodes.

6. The logic circuit of claim 2 wherein level shifter means (D41, ...) is inserted the said base of second input transistor and said additional input transistors.

7. The logic circuit of claim 3 wherein a resistor (R42, R43, is connected to the base of said second transistor and to each of the bases of said additional input transistors.

8. The logic circuit of claim 2 wherein said AND gate consists of diodes (D431, ...) whose anodes are connected together and loaded by a resistor (RD41).

9. The logic circuit of claim 1 wherein first supply voltage (VPP) is lower than 3.4 V.

10. The logic circuit of claim 1 further including:
at least one translator circuit (42) including an emitter-follower transistor (TY2) which is driven by the potential at said tree output node.

* * * * *

UNITED STATES PATENT AND TRADEMARK OFFICE
CERTIFICATE OF CORRECTION

PATENT NO. : 5,075,574
DATED : December 24, 1991
INVENTOR(S) : G. Boudon

It is certified that error appears in the above-identified patent and that said Letters Patent is hereby corrected as shown below:

Cover Sheet, Line 21: Change "inpout" to --input--.

Column 2, Line 2: Change "~~out~~" to --OUT--.

Column 8, Line 9: Change "($\overline{Z41} + \overline{Z45}$)" to --($\overline{Z41} + \overline{Z42}$)--.

Column 14, Line 22: After "said base of" insert --said--.

Signed and Sealed this

Thirteenth Day of July, 1993

Attest:

MICHAEL K. KIRK

Attesting Officer    Acting Commissioner of Patents and Trademarks